US006611039B2

(12) United States Patent
Anthony

(10) Patent No.: US 6,611,039 B2
(45) Date of Patent: Aug. 26, 2003

(54) VERTICALLY ORIENTED NANO-FUSE AND NANO-RESISTOR CIRCUIT ELEMENTS

(75) Inventor: Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/964,770

(22) Filed: Sep. 28, 2001

(65) Prior Publication Data

US 2003/0062590 A1 Apr. 3, 2003

(51) Int. Cl.[7] ............... H01L 29/00; H01L 23/52; H01L 29/40; H01L 21/4763; H01L 23/48
(52) U.S. Cl. ............... 257/529; 257/734; 257/758; 257/759; 257/774; 257/776; 438/622; 438/625
(58) Field of Search .................. 257/758, 759, 257/776, 734, 774, 529; 438/622, 625

(56) References Cited

U.S. PATENT DOCUMENTS 6,031,287 A * 2/2000 Harshfield ............... 257/734
6,344,371 B2 * 2/2002 Fischer et al. ............ 438/106

OTHER PUBLICATIONS

IBM Technical Disclosure Bulletin; vol. 9, Feb. 1992.*

* cited by examiner

Primary Examiner—Nathan J. Flynn
Assistant Examiner—Victor A. Mandala, Jr.

(57) ABSTRACT

Vertically oriented nano-circuits including fuses and resistors allow for significant densities to be achieved. The vertically oriented nano-circuits can be fabricated using standard known processes such as Damascene, wet etching, reactive etching, etc. Thus little additional capital expenditure is required other than to acquire present state-of-the-art equipment. Devices using these vertically oriented nano-circuits are also inexpensive to manufacture.

20 Claims, 12 Drawing Sheets

VERTICALLY ORIENTED NANO-FUSE AND NANO-RESISTOR CIRCUIT ELEMENTS

RELATED APPLICATIONS

The following applications of the common assignee may contain some common disclosure and may relate to the present invention:

U.S. patent application Ser. No. 09/964,768, entitled "ONE TIME PROGRAMMABLE FUSE/ANTI-FUSE COMBINATION BASED MEMORY CELL";

U.S. patent application Ser. No. 09/924,500, filed Aug. 9, 2001, entitled "ONE-TIME PROGRAMMABLE UNIT MEMORY CELL BASED ON VERTICALLY ORIENTED FUSE AND DIODE AND ONE-TIME PROGRAMMABLE MEMORY USING THE SAME"; and U.S. patent application Ser. No. 09/924,577, filed Aug. 9, 2001, entitled "ONE-TIME PROGRAMMABLE MEMORY USING FUSE/ANTI-FUSE AND VERTICALLY ORIENTED FUSE UNIT MEMORY CELLS".

FIELD OF THE INVENTION

This invention relates generally to nano-circuits. More particularly, the invention relates to vertically oriented nano-fuses and nano-resistors in manufacturing semiconductor devices.

BACKGROUND OF THE INVENTION

The demand for semiconductor devices has increased dramatically in recent years. One can readily observe the pervasiveness of consumer electronic devices in the modern world. Most or all of the consumer electronic devices are made possible because of developments in the semiconductor devices. As the electronic devices become smaller, more sophisticated, and less expensive, increasingly higher densities of the semiconductor devices are demanded at a lower cost in today's market place. This requires that the circuits within the device be more dense as well.

One of the basic circuit elements may be a fuse or a resistor, which may be electrically connected to conductors. The electrical connection may be maintained with an addition of a diode or other circuit elements in series with the fuse and/or the resistor.

In some semiconductor devices, thin film fuses and resistors are lithographically patterned in the plane of the semiconductor substrate to create a circuit element. Circuits made of such elements are adequate for low density application. Unfortunately, in order to integrate a planar fuse or resistor into a circuit requires a minimum area of $8\lambda^2$ (where $\lambda$ is the minimum photolithographic feature size), since a contact region is needed on each end of the fuse. Generally the fuse occupies space even larger than $8\lambda^2$. As such, their use in high density applications is limited due to a consumption of a significant amount of silicon ("Si") real estate. Thus, thin film fuses and/or resistors typically are not used in application where density is critical.

SUMMARY OF THE INVENTION

In one respect, an exemplary embodiment of a vertically oriented nano-circuit may include a top conductor extending in a first direction and a bottom conductor extending in a second direction. The top and bottom conductors may define an overlap, and the two conductors may be electrically connected. The vertically oriented nano-circuit may also include a vertically oriented conductive spacer formed between the top and bottom conductors in the overlap region. The conductive spacer may be electrically connected with both top and bottom conductors. The conductive spacer may be a vertically oriented nano-fuse or a vertically oriented nano-resistor. A second circuit element, perhaps vertically oriented as well, may be connected in series with the vertically oriented conductive spacer.

In another respect, an exemplary embodiment of a method to form a vertically oriented nano-circuit may include forming a top conductor extending in a first direction and forming a bottom conductor extending in a second direction. Again, the top and bottom conductors may define an overlap. The method may also include forming a vertically oriented conductive spacer in the overlap and such that top and bottom conductors are electrically connected.

The above disclosed exemplary embodiments may be capable of achieving certain aspects. For example, a thin film conductive element, either a fuse or a resistor, when oriented perpendicular to the substrate plane, is ideally suited to be placed between adjacent metallization levels, which allows for a dramatically increased density. The element may be inserted between tow metallization levels without the need for additional area beyond the area of overlap of the two metallization levels. Also, the fuse or the resistor may be easily combined in series with an anti-fuse or a diode with no loss in density. In addition, the devices can be made with well-known semiconductor processes, such as the Damascene process. Thus, little to no capital investment may be required beyond the currently existing equipment.

BRIEF DESCRIPTION OF THE DRAWINGS

Features of the present invention will become apparent to those skilled in the art from the following description with reference to the drawings, in which.

DETAILED DESCRIPTION

For simplicity and illustrative purposes, the principles of the present invention are described by referring mainly to exemplary embodiments thereof. However, one of ordinary skill in the art would readily recognize that the same principles are equally applicable to many types of nano-circuits with vertically oriented conductive spacers and methods of fabrication thereof.

Vertically oriented conductive spacers have current flow within that is substantially vertical, i.e. perpendicular to the plane of the substrate. The vertically oriented conductive spacer is typically manufactured such that a ratio of vertical height to lateral thickness of the spacer is at least 1, and is generally substantially greater than 1, perhaps as much as 30 to 1 or more. As such, the lateral area consumption is kept to a minimum, which in turn allows for high density to be achieved.

Figure 1A:
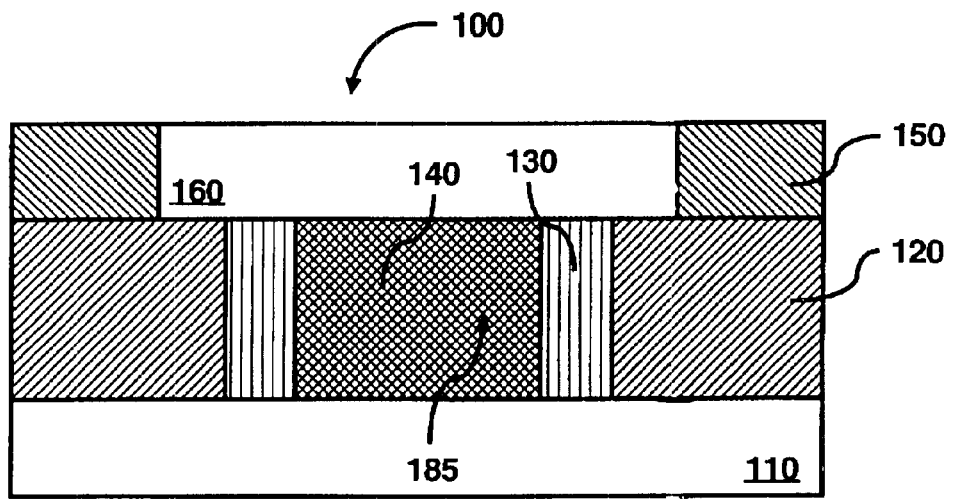
FIG. 1A illustrates a cross-sectional view of a first embodiment of a vertically oriented nano-circuit according to an aspect of the present invention.

FIG. 1A illustrates a cross-sectional view of a first embodiment of a nano-circuit 100 according to an aspect of the present invention. As shown in FIG. 1A, the nano-circuit 100 may include a bottom conductor 110 and a first insulator 120 situated above the bottom conductor 110. The first insulator 120 is formed around a perimeter of a closed region 185. As will be demonstrated below, the closed region 185 substantially occupies a region defined by an overlap 115 (shown in FIG. 1B) of the nano-circuit 100.

To form the bottom conductor 110, conductive materials such as aluminum, copper, gold, tungsten, and the like and any alloys thereof can be used. Polysilicon may also be used to form the bottom conductor 110. To form the first insulator 120, materials such as silicon oxides and nitrides, aluminum oxides and nitrides, silicon oxynitrides, tantalum oxides, and the like can be used.

The nano-circuit 100 may also include a vertically oriented conductive spacer 130 and an insulating plug 140. The conductive spacer 130 is typically a vertically oriented nano-fuse or nano-resistor. The vertically oriented conductive spacer 130 and the insulating plug 140 may substantially occupy an edge and a center of the closed region 185, respectively, above the bottom conductor 110. Tops of the insulator 120, the conductive spacer 130, and the insulating plug 140 may be coplanar.

If the vertically oriented conductive spacer 130 is a nano-fuse, materials such as semiconductors (e.g. Si, Ge), conductors (e.g. Al, Cu, Ag, Au, Pt), low melting temperature material (e.g. In, Zn, Sn, Pb), refractory metals (e.g. Ta, W), transition metals (Ni, Cr) and the like and any alloys thereof can be used. If the conductive spacer is a resistor, materials such as semiconductors (e.g. Si, Ge), silicides (e.g. PtSi, WSi, TaSi), high resistivity materials (e.g. TaN, TaSiN, WN, WSiN), metals (e.g. Cu, Al, Ta, W), carbon, and the like can be used. Also, the materials used to form the first insulator 120 can generally be used to form the insulating plug 140, although in certain embodiments it may be desirable for the insulating plug 140 to be etched away leaving a void.

Note that the insulating plug 140 is not strictly necessary. The insulating plug 140 helps to control the cross-sectional area of the conductive spacer 130 in a plane parallel to the substrate plane, for example the area of the conductive spacer 130 contacting the bottom conductor 110. Presumably, it is possible that the conductive spacer 130 can be fabricated with the appropriate amount of surface area such that the insulating plug 140 is not necessary.

The nano-circuit 100 may still further include a second insulator 150 and a top conductor 160, both situated above the first insulator 120, the vertically oriented conductive spacer 130 and the insulating plug 140. While FIG. 1A shows that the top conductor 160 covers the entirety of the conductive spacer 130 at the top of the closed region 185, this is not a requirement to practice the present invention. Similarly, FIG. 1A also shows that the bottom conductor 110 covers the entirety of the conductive spacer 130 at the bottom of the closed region 185, but this is not a requirement as well.

While complete coverage is shown, it is required only that a conductive path between the top and the bottom conductors 160 and 110 exists. Thus, electrical connections should exist among the bottom conductor 110, the conductive spacer 130, and the top conductor 160. It is not necessary that the bottom conductor 110, the fuse 130 and the top conductor 160 be in physical contact with each other.

FIG. 1A also shows that an inner wall of the vertically oriented conductive spacer 130 is bounded by the insulating plug 140 and an outer wall is bounded by the first insulator 120. However, it is not strictly necessary that the bounds of the walls of the vertically oriented conductive spacer be strictly determined by the insulating plug 140 and the first insulator 120.

Note that the second insulator 150 can be formed from similar materials used to form the first insulator 120 and the insulating plug 140, and the top conductor 160 can be formed from similar materials used to form the bottom conductor 110.

In general, the top and bottom conductors are parallel to a substrate of the semiconductor device upon which the nano-circuit 100 is fabricated. As seen, the current flow within the vertically oriented conductive spacer 130—either a vertically oriented nano-fuse or nano-resistor—is substantially vertical. This structure allows the conductive spacer 130 to be inserted between adjacent conductors.

Figure 1B:
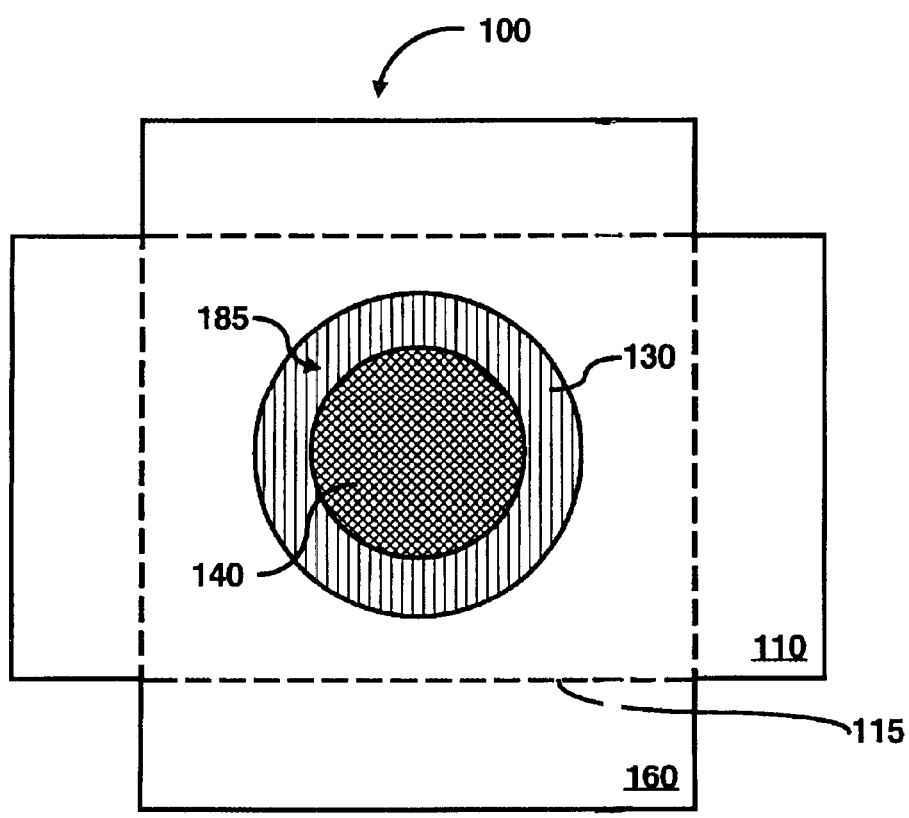
FIG. 1B illustrates a top view the first embodiment of FIG. 1A showing the overlapping nature of the nano-circuit.

FIG. 1B illustrates a top view of the first embodiment of FIG. 1A showing the vertically oriented conductive spacer 130 and the insulating plug 140 substantially occupying the edge and center of the closed region 185, which is located within the overlap 115 of the top and bottom conductors 160 and 110. The top and bottom conductors 160 and 110 extend in their respective directions to form the overlap 115 (shown as a dashed line region for illustrative purposes). Even though the closed region 185 is shown to be entirely located within the overlap 115, this is not strictly required. As noted above, it is only necessary that electrical connectivity is maintained between the top and bottom conductors 160 and 110 through the structure within the closed region 185.

For simplicity, the first and second insulators 120 and 150, respectively, are not included in FIG. 1B. Also, for illustrative purposes, the vertically oriented conductive spacer 130 and the insulating plug 140 are shown at the overlap 115. However, the top conductor 160 would generally completely cover the conductive spacer 130 and the insulating plug 140.

Also, in FIG. 1B, the closed region 185 is shown as being cylindrical with the vertically oriented conductive spacer 130 substantially occupying an annulus of the closed region 185 and the insulating plug 140 substantially occupying a center of the closed region 185. However, the shape of the closed region 185 is not so limited and may include other shapes as well, such as a rectangle, a square, an ellipse, or any other enclosed shapes. Again, the insulating plug 140 may be partially or wholly etched away to leave a void.

Figure 1C:
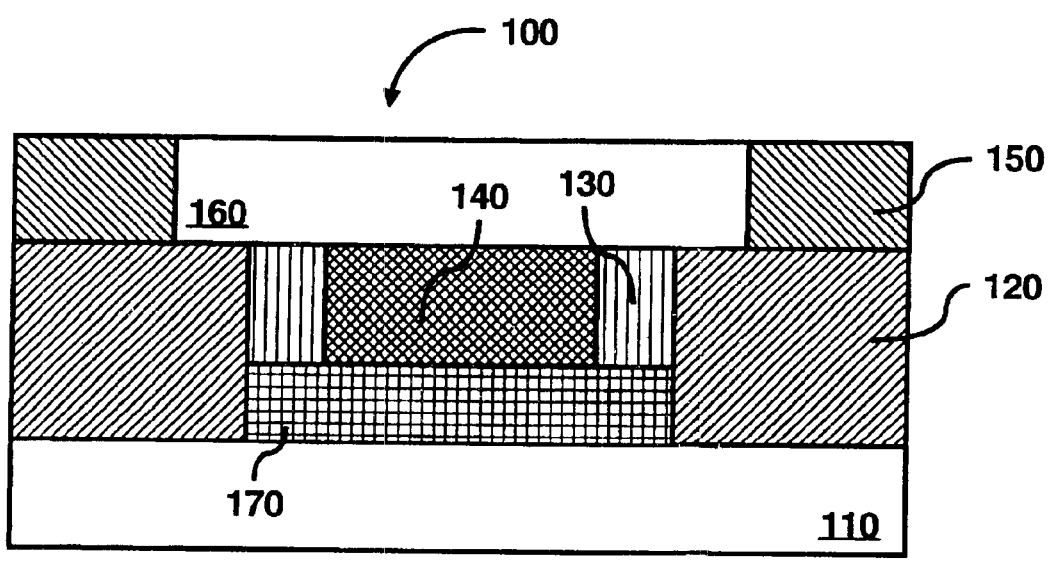
FIG. 1C illustrates a variation of the first embodiment of FIG. 1A.

FIG. 1C illustrates a variation on the first embodiment of FIG. 1A. A second conductive spacer 170 is placed between the vertically oriented conductive spacer 130 and the bottom conductor 110. This is just to illustrate that other nano-circuit elements can be integrated into the nano-circuit 100. The second conductive spacer 170 may be a diode, resistor, anti-fuse, and the like. While not shown, the second conductive spacer 170 may also be placed between the vertically oriented conductive spacer 130 and the top conductor 160. Note that the electrical connectivity between the top and bottom conductors 160 and 110 is not destroyed by the addition of the second conductive spacer 170.

As mentioned previously, some, or all, of the insulating plug 140 may be etched away leaving a void in the region of the insulating plug 140. This configuration provides extremely low thermal conductivity adjacent to the conductive spacer 130. This is useful, for example, if the spacer 130 is a fuse. The void provides space for molten or evaporated fuse material to enter, which lowers the power necessary to break the vertically oriented fuse.

Figure 2A:
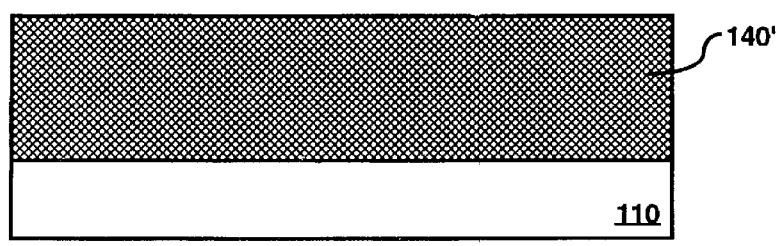
FIGS. 2A–2G illustrate cross-sectional views of an exemplary embodiment of a method of fabricating the first embodiment of the vertically oriented nano-circuit.

FIGS. 2A–2G illustrate cross-sectional views of an exemplary embodiment of a method of fabricating the first embodiment of the nano-circuit 100 of FIG. 1A. As shown in FIG. 2A, a conductive material may be deposited and patterned to form the bottom conductor 110. As part of the patterning process, the bottom conductor 110 may be planarized, by using well-known methods such as chemical-mechanical polishing ("CMP").

Figure 2B:
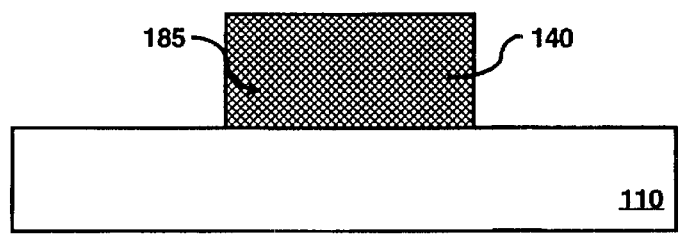

Subsequently, a dielectric film 140' may be deposited over the bottom conductor 110. Then, as shown in FIG. 2B, the dielectric film 140' may be etched to form the insulating plug 140. Standard lithography and etch methods may be used to form the insulating plug 140.

Figure 2C:
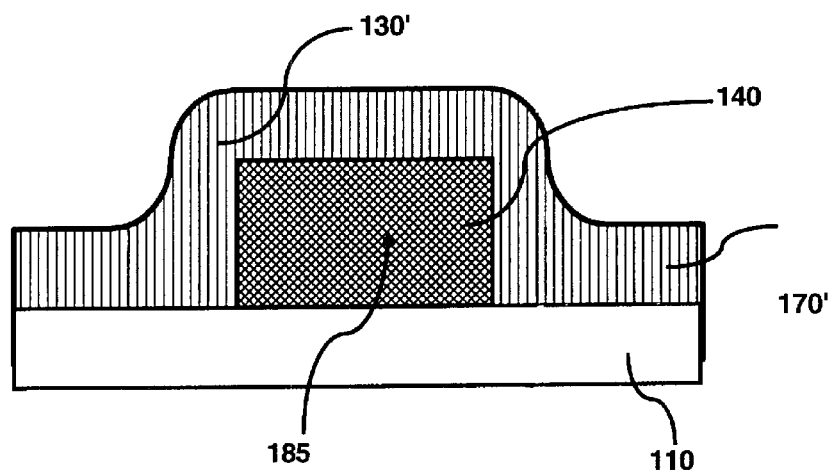
Figure 2D:
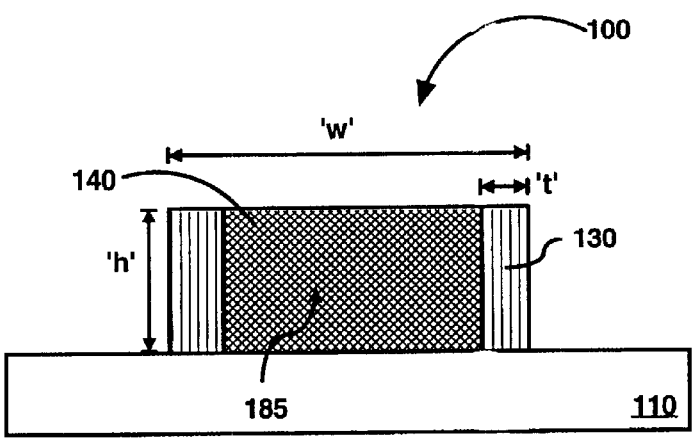

Then, as shown in FIG. 2C, a conductive spacer material 130' may be deposited over the bottom conductor 110 and even over the insulating plug 140. A deposition method such as atomic layer deposition (ALD) may be used to ensure a conformal coating and precise control of the thickness of the fuse material 130'. Afterwards, the conductive spacer material 130' may be etched to leave the conductive spacer material 130' primarily on the wall of the insulating plug 140 and thereby forming the vertically oriented conductive spacer 130, as shown in FIG. 2D. The conductive spacer 130 may be formed by anistropically etching the conductive spacer material 130' using ion etching, reactive ion etching, or other etching methods.

Note that the vertically oriented conductive spacer 130 is generally formed within the closed region 185 so that the bottom conductor 110 is exposed in areas perimeter to the closed region 185. Note also that the ratio of the vertical height 'h' of the vertically oriented conductive spacer 130 to the width 'w' of the closed region 185 can be large such as 5 to 1 or more. When anisotropic etching is used, the process inherently leaves behind the conductive spacer 130 primarily on the vertical sidewalls of the insulating plug 140. Thus lateral area consumption is kept to a minimum, which allows for precise control of the lateral thickness 't' of the conductive spacer 130. Note that the vertical height 'h' to lateral thickness 't' ratio of the conductive spacer 130 can be extremely large, such as 30 to 1 or more.

Figure 2E:
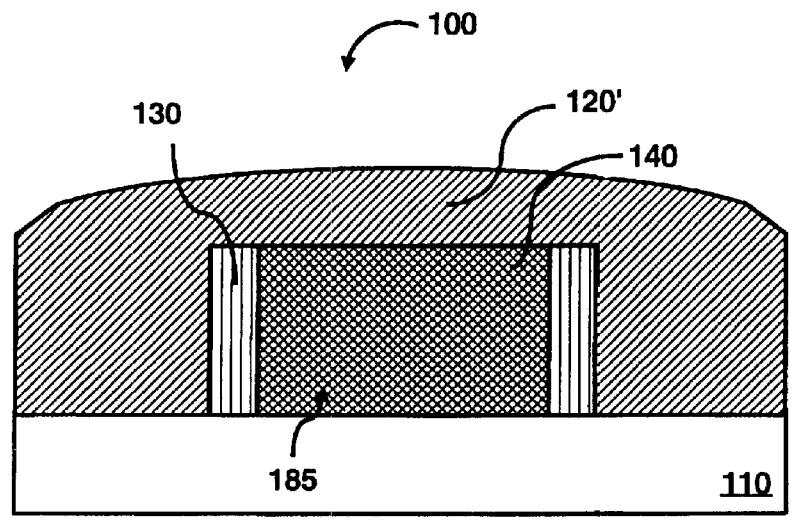
Figure 2F:
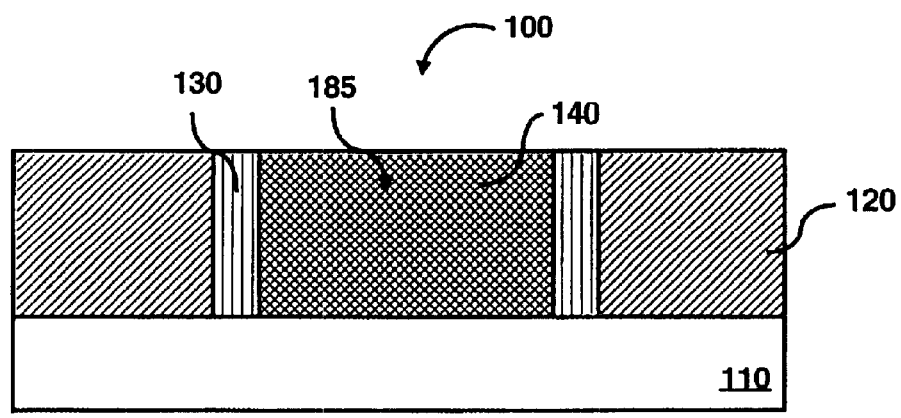

Then as shown in FIG. 2E, an insulating material 120' may be deposited over the bottom conductor 110 covering the area outside the perimeter of the closed region 185. Then the insulating material 120' is patterned to form the first insulator 120 as shown in FIG. 2F. The first insulator 120 may be patterned by planarizing the insulating material 120' to expose the conductive spacer 130 and the insulating plug 140, again using CMP and/or other planarizing method(s). Indeed, the tops of the first insulator 120, conductive spacer 130, and insulating plug 140 may define a plane. At this point the vertically oriented conductive spacer 130 is bounded on all vertical sides by insulator. This configuration reduces heat transfer from the conductive spacer 130 to its surroundings.

Figure 2G:
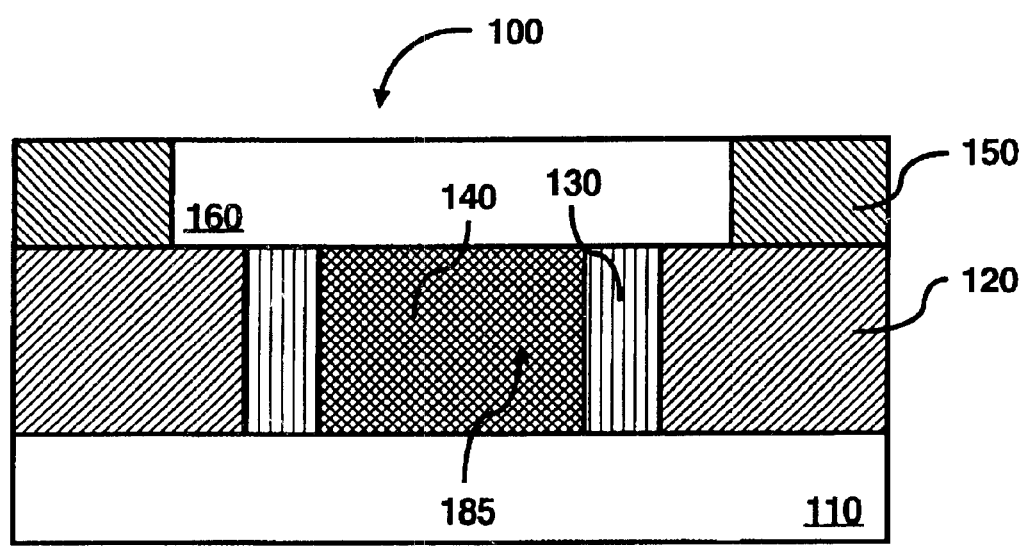

Then to complete the process, a top conductor 160 may be deposited and patterned in the first direction over the conductive spacer 130, the insulating plug 140 and the first insulator 120. If desired, the second insulator 150 may be deposited over the top conductor 160 and first insulator 120 and planarized using CMP or other planarizing methods. The resulting structure is shown in FIG. 2G (same as FIG. 1A).

If a void is desired in the region of the insulating plug 140, then the insulating material can be removed by either wet or dry etching after definition of the top conductor 160. Access to the insulating plug 140 may be possible when the top conductor 160 does not completely cover the insulating plug 140. In other words, to generate a void region, the top conductor 160 and insulating plug 140 may be misaligned with respect to one another such that a portion of the insulating plug 140 is exposed for etching. After creating the void, the second insulator 150 can be deposited and patterned to complete the nano-circuit.

While not shown, one of ordinary skill in the art may easily modify the processing steps as illustrated in FIGS. 2A–2G to fabricate the variation as shown in FIG. 1C.

Figure 3A:
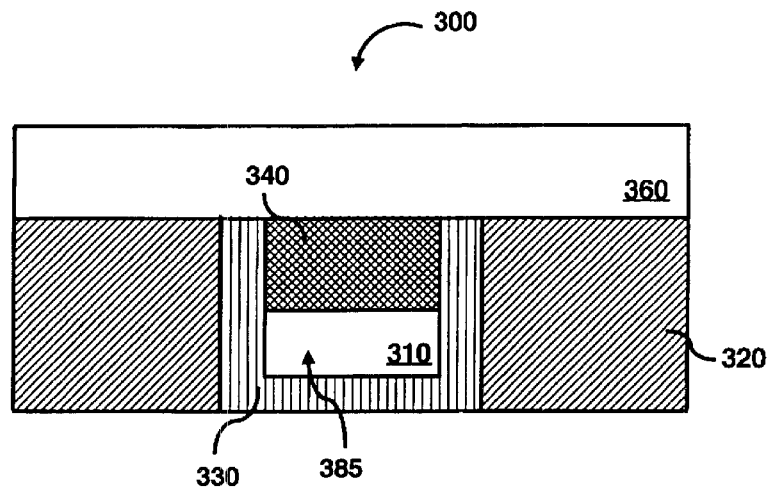
FIG. 3A illustrates a cross sectional view of a second embodiment of a vertically oriented nano-circuit according to another aspect of the present invention.

FIG. 3A illustrates a cross-sectional view of a second embodiment of a nano-circuit 300 according to an aspect of the present invention. As shown, the nano-circuit 300 may include a conductive spacer 330 and an insulator 320 formed on either side of the conductive spacer 330, i.e. the exterior of the conductive spacer 330. As will be seen later, the interior of the conductive spacer 330 may or may not be completely filled.

The nano-circuit 300 may also include a bottom conductor 310. Note that vertical portions of the conductive spacer 330 and the bottom conductor 310 make up a 'U' region 385. This 'U' region concept is better illustrated in FIG. 3D where the two vertical portions of the conductive spacer 330 and the bottom conductor 310 make up the 'U' region 385, i.e. there is no horizontal portion to the conductive spacer 330. The horizontal portion of the conductive spacer 330 of FIG. 3A is not necessary to practice the invention.

The nano-circuit 300 may further include an insulating plug 340 occupying some or substantially all of the interior of the 'U' region 385, i.e. interior of the conductive spacer 330. The nano-circuit 300 may still further include a top conductor 360 above the above the 'U' region 385 and the insulator 320. Note that the conductive spacer 330 and the insulating plug 340 may define a plane.

Materials used to form the various parts of the nano-circuit have been discussed above, and thus will not be repeated. Again, for reasons discussed before, the insulating plug 340 is not strictly necessary. Further, when the insulating plug 340 is present, top surfaces of the insulator 320, vertically oriented conductive spacer 330, and the insulating plug 340 may be coplanar.

Figure 3B:
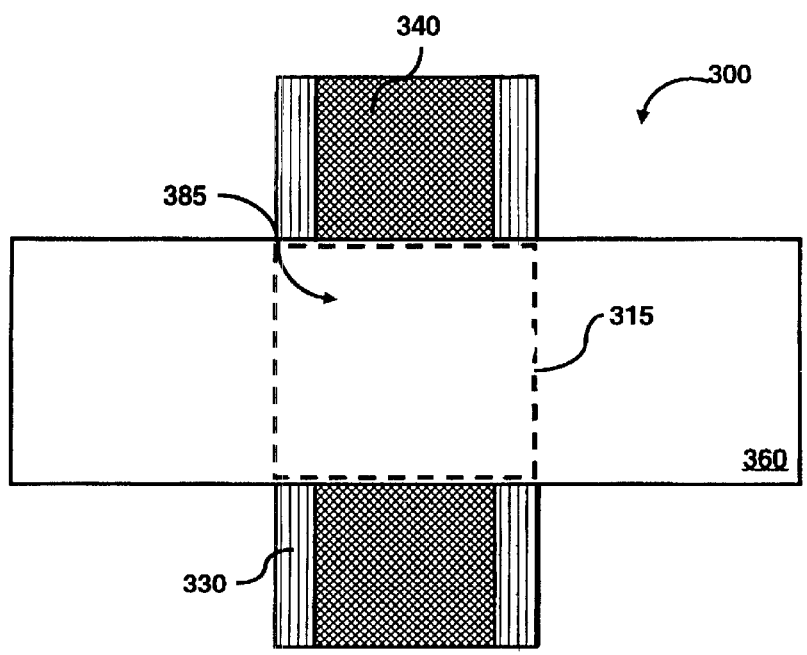
FIG. 3B illustrates a top view the first embodiment of FIG. 3A showing the overlapping nature of the nano-circuit.

FIG. 3B illustrates a top view of the second embodiment of the nano-circuit 300 of FIG. 3A. As shown, the top conductor 360 may extend in a first direction. The conductive spacer 330, and thus the 'U' region 385, including the insulating plug 340 and the bottom conductor 310 (not shown in FIG. 3B) may extend in the second direction and thereby defining an overlap 315, in this instance a cross-point, at the intersection.

Note that if the vertically oriented conductive spacer 330 is a nano-resistor, it behaves as two resistors in parallel, even though the nano-resistor 330 may be physically one continuous piece shaped like the letter 'U' as shown in FIG. 3A. This is because any electrical current between the top and bottom conductors 360 and 310 is forced through the nano-resistor at both edges of the 'U' region 385 due to the insulating plug 340. However, below the insulating plug 340, most or all of the current will be conducted through the bottom conductor 310.

Figure 3C:
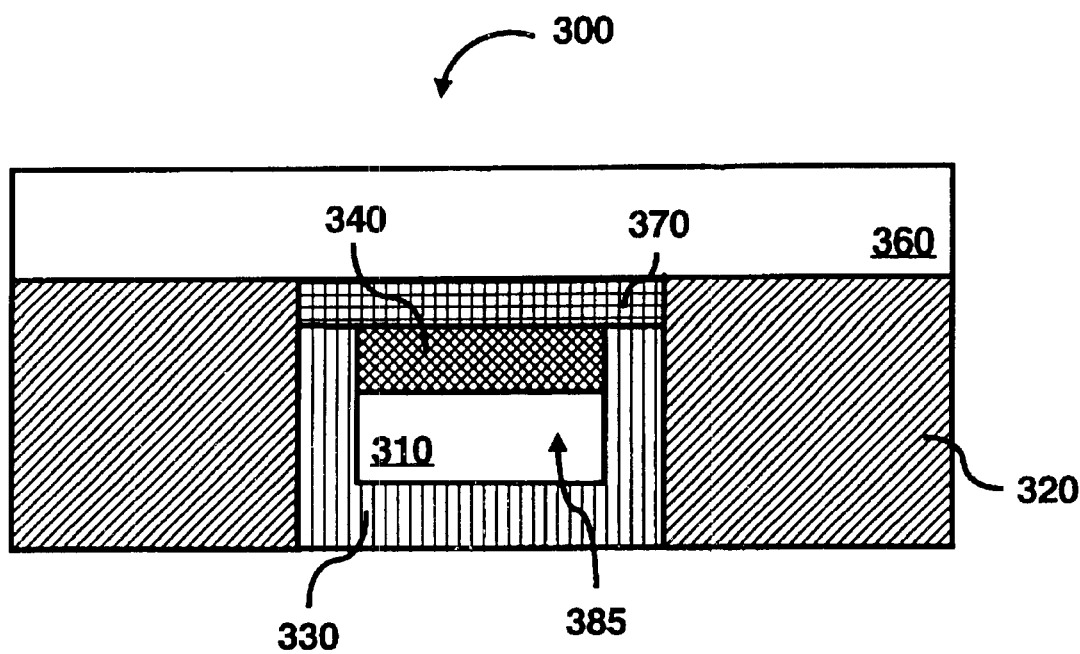
FIGS. 3C–3D illustrate variations on the first embodiment of FIG. 3A.
Figure 3D:
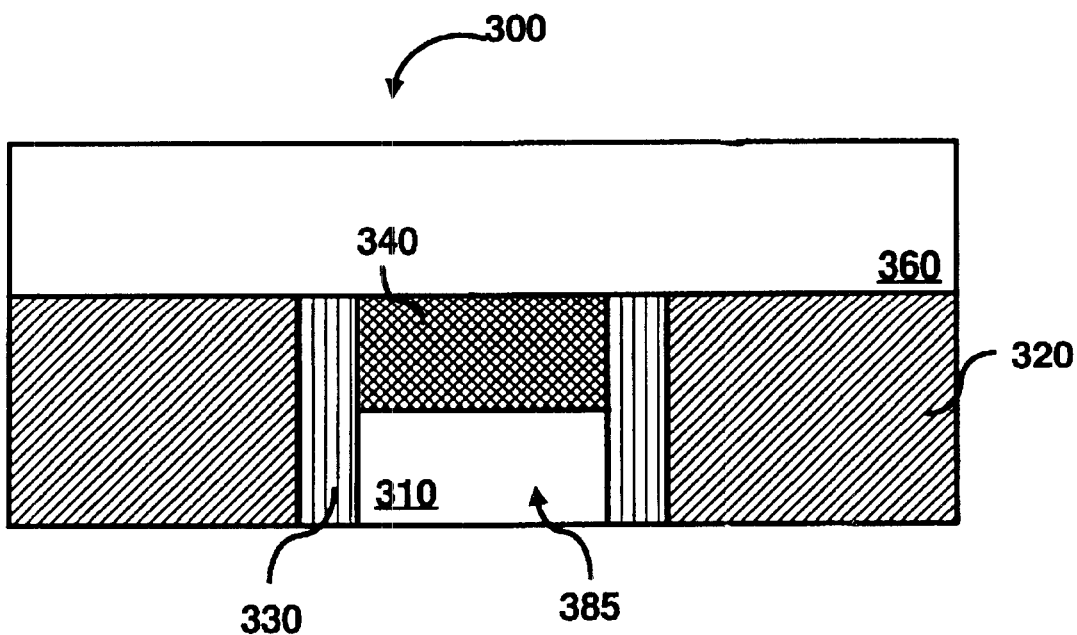

FIGS. 3C and 3D illustrate variations on the first embodiment of FIG. 3A. In FIG. 3C, a second circuit element 370 is placed between the vertically oriented conductive spacer 330 and the bottom conductor 310. This is just to illustrate that other circuit elements can be integrated the vertically oriented circuit 300. The second circuit element 370 may be a diode, resistor, anti-fuse, and the like. Again, while not shown, the second circuit element 370 may also be placed between the vertically oriented conductive spacer 330 and the bottom conductor 310. Note that the electrical connectivity between the top and bottom conductors 360 and 310 is not destroyed by the addition of the second circuit element 370.

FIG. 3D, in addition to clarifying the 'U' region 385, also illustrates a variation of the on the second embodiment of FIG. 3A. As noted above, the horizontal portion of the conductive spacer 330 is not necessary to practice the invention. FIG. 3D demonstrates this concept.

While the foregoing descriptions of the memory cell associated FIGS. 3A–3D indicate that the vertically oriented conductive spacer 330, insulating plug 340, and 'U' region 385 extend in a second direction along with the bottom conductor 310, this orientation is not required to practice the present invention. Indeed, the vertically oriented conductive spacer 330 can be associated with the top conductor 360 and extend in a first direction. In this case the vertical portions of the conductive spacer 330 and the top conductor 360 now make up an inverted 'U' region 385. An insulating plug 340 can once again occupy some or substantially all of the inverted 'U' region 385. The memory cell 300 may still further include an anti-fuse 380 substantially occupying the bottom of the inverted 'U' region 385 above bottom conductor 310.

Figure 4A:
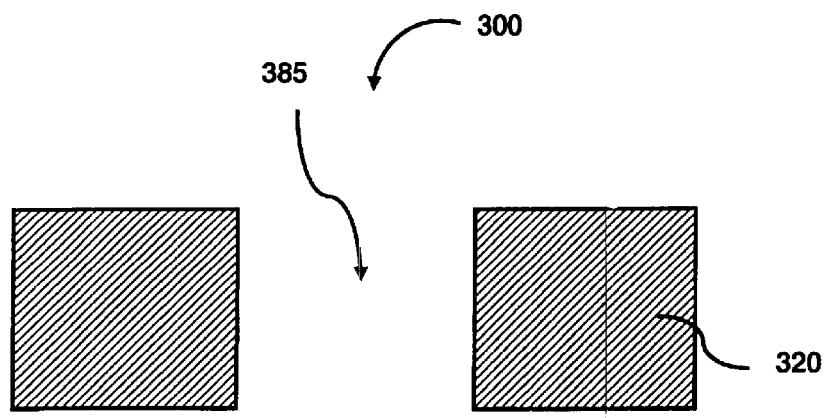
FIGS. 4A–4G illustrate cross-sectional views of an exemplary embodiment of a method of fabricating the second embodiment of the vertically oriented nano-circuit.

FIGS. 4A–4G illustrate cross-sectional views of an exemplary embodiment of a method of fabricating the second embodiment of the nano-circuit 300 of FIG. 3A. As shown in FIG. 4A, an insulator material may be deposited and patterned to form the insulator 320. The insulator 320 may be patterned to define a trench where the 'U' region 385 will be formed. Again, the height to width ratio of the closed region 385 can be large (5 to 1 or more).

Figure 4B:
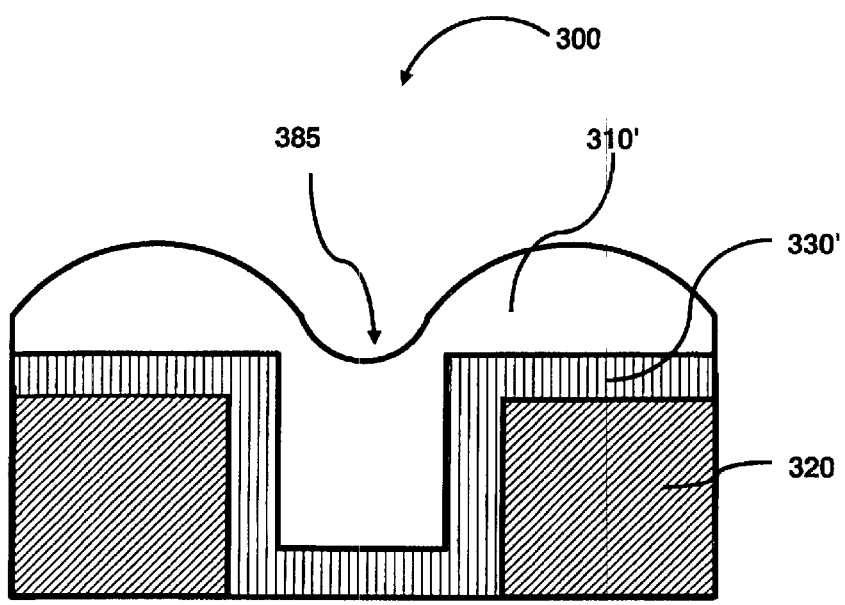

Then, as shown in FIG. 4B, a conductive spacer material 330' may be deposited into the trench and even over the insulator 320. The deposition naturally creates the 'U' shape of the conductive spacer 330. Conformal coating of the first insulator 320, including vertical walls, may be achieved using deposition methods as ALD and the like. Then a conductor material 310' is deposited over the conductive spacer material 330' including into the 'U' region 385.

Figure 4C:
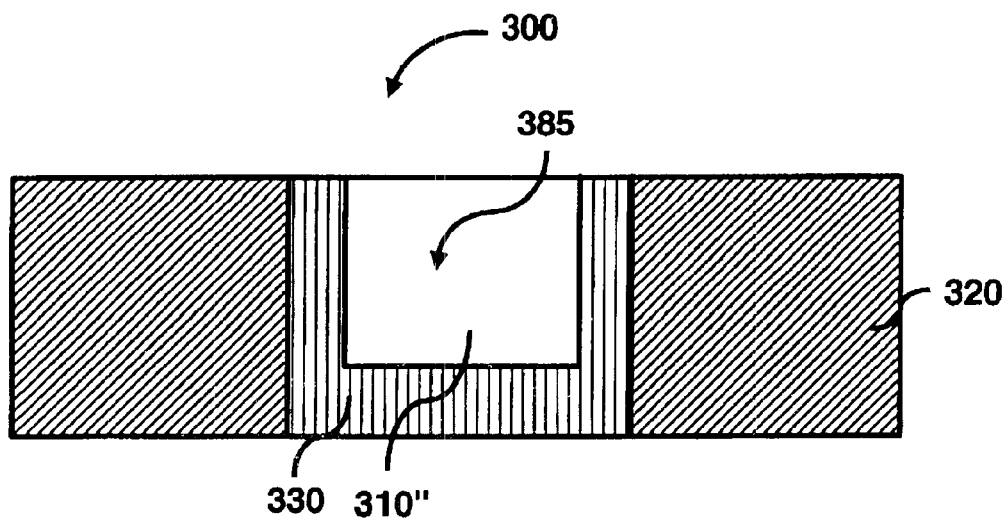

Then as shown in FIG. 4C, the conductive spacer material 330' and the conductor material 310' may be planarized using standard methods such as the CMP. At this point, the insulator 320, the bottom conductor 310, and the conductive spacer 330 may be coplanar.

Figure 4D:
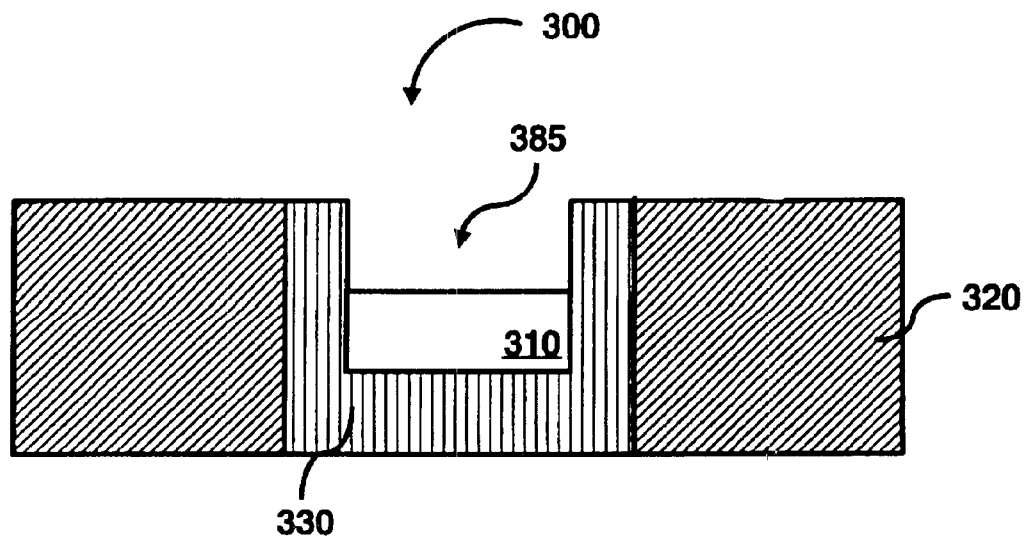

Then, as shown in FIG. 4D, the bottom conductor 310 may be preferentially etched using etching techniques such as wet etching, reactive ion etching, ion milling, and the like to a prescribed depth so that the bottom conductor 310 forms a lateral portion of the 'U' region 385.

Figure 4E:
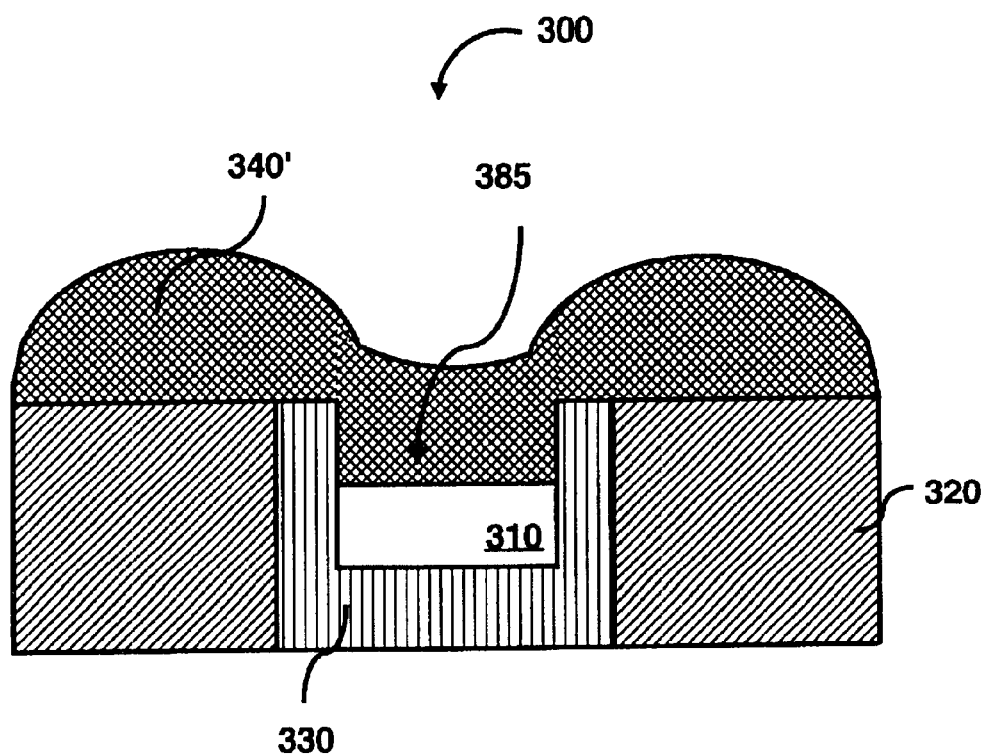
Figure 4F:
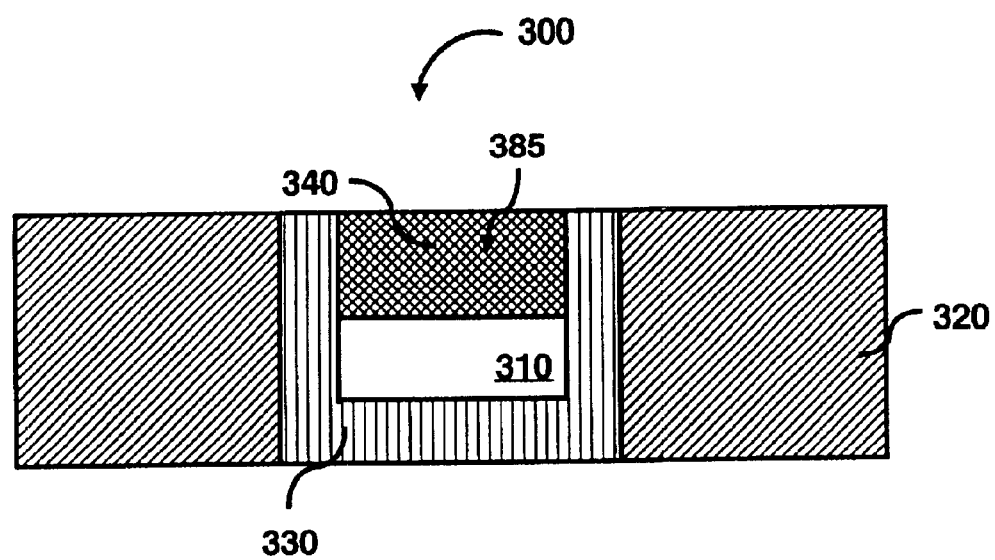

Then, as shown in FIG. 4E, an insulating plug material 340' may be deposited to fill the interior of the 'U' region 385, and the resulting surface may be planarized. At this point, the insulating plug 340, the insulator 320, and the conductive spacer 330' may be coplanar as shown in FIG. 4F.

Figure 4G:
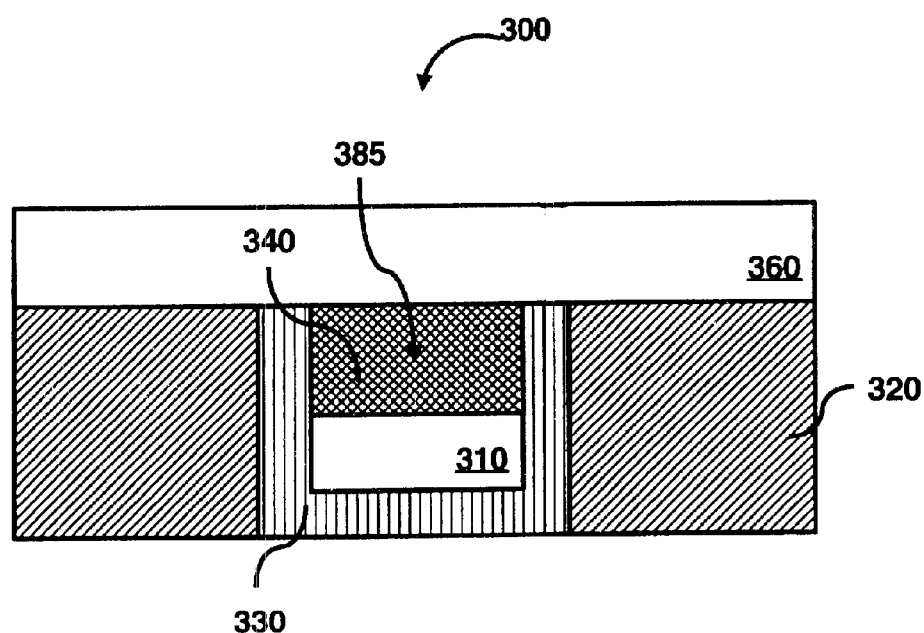

Then, to complete the process, another conductor material may be deposited and optionally patterned to form the top conductor 360 as shown in FIG. 4G (same as FIG. 3A). Planarizing the top conductor 360 may be part of the fabrication process.

The steps indicated by FIGS. 4A–4G may be modified to fabricate the variations as shown in FIGS. 3C–3D by one of ordinary skill. And again, a void may be created similar to as discussed with reference to the first embodiment.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A vertically oriented nano-circuit, comprising:

a top conductor extending in a first direction;

a bottom conductor extending in a second direction so as to define an overlap between said top and bottom conductors, wherein said first and second directions are not parallel, said bottom conductor having electrical connectivity with said top conductor;

a vertically oriented conductive spacer formed in said overlap having electrical connectivity with sad top and bottom conductors; and an insulating plug substantially occupying a center of said overlap such that said insulating plug directly contacts said top and bottom conductors.

2. The vertically oriented nano-circuit of claim 1, wherein:

said vertically oriented conductive spacer is a vertically oriented nano-fuse.

3. The vertically oriented nano-circuit of claim 1, wherein said vertically oriented conductive spacer may be at least one of a semiconductor, conductor, low melting temperature material, refractory metal, transition metal, silicide, high resistivity material, and carbon.

4. The vertically oriented nano-circuit of claim 3, wherein:

said semiconductor includes at least one of Si and Ge;

said conductor includes at least one of Al, Cu, Ag, Au, Pt, and alloys thereof;

said low melting temperature material includes at least one of In, Zn, Sn, Pb, and alloys thereof;

said refractory metal includes at least one of Ta, W, and alloys thereof;

said transition metal includes at least one of Ni, Cr, and alloys thereof;

said silicide includes at least one of PtSi, WSi, and TaSi; and said high resistivity material includes at least one of TaN, TaSiN, WN, WsiN.

5. The vertically oriented nano-circuit of claim 1, wherein:

said vertically oriented conductive spacer is shaped such that a void exists in said conductive spacer substantially about a center of said conductive spacer.

6. The vertically oriented nano-circuit of claim 1, wherein said conductive spacer substantially occupies a closed region near said region of overlap such that an inner wall of said conductive spacer is bounded by said insulating plug, said vertically oriented nano-circuit Further comprising:

an insulator formed around a perimeter of said closed region such that an outer wall of said conductive spacer is bounded by said insulator.

7. The vertically oriented nano-circuit of claim 6, wherein:

each of said top and bottom conductors is composed of at least one of polysilicon, aluminum, copper, gold, tungsten, and any alloys made therefrom; and each of said insulator and said insulating plug is composed of at least one of silicon oxides, silicon nitrides, aluminum oxides, aluminum nitrides, silicon oxynitrides, and tantalum oxides.

8. The vertically oriented nano-circuit of claim 1, wherein:

a vertical height to lateral thickness ratio of said vertically oriented conductive spacer is unity or greater.

9. The vertically oriented nano-circuit of claim 1, wherein said vertically oriented conductive spacer extends in one of said first and second directions.

10. The vertically oriented nano-circuit of claim 9, further comprising:

an insulator formed at an exterior region of said vertically oriented conductive spacer; and an insulating plug formed at an interior region of said vertically oriented conductive spacer.

11. The vertically oriented nano-circuit of claim 1, wherein:

tops of said vertically oriented conductive spacer and said insulating plug are coplanar.

12. A method to form a vertically oriented nano-circuit, comprising:

forming a top conductor extending in a first direction;

forming a bottom conductor extending in a second direction so as to define an overlap between said top and bottom conductors, wherein said first an second directions are not parallel, said bottom conductor having electrical connectivity with said top conductor;

forming a vertically oriented conductive spacer in said overlap having electrical connectivity with said top and bottom conductors; and forming an insulating plug substantially occupying a center of said overlap such that said insulating plug directly contacts said top and bottom conductors.

13. The method of claim 12, wherein said vertically oriented conductive spacer is a vertically oriented nano-fuse.

14. The method of claim 12, wherein forming a void in an interior of said vertically oriented conductive spacer.

15. The method of claim 12, further comprising:

forming said insulating plug substantially in a center of a closed region near said overlap such that an inner wall of said vertically oriented conductive spacer is bounded by said insulating plug; and forming an insulator around a perimeter of said closed region such that an outer wall of said conductive spacer is bounded by said insulator.

16. The method of claim 12, wherein a vertical height of said vertically oriented conductive spacer is equal to or greater than a width of a closed region near said overlap.

17. The method of claim 12, wherein a vertical height to lateral thickness ratio of said vertically oriented conductive spacer is unity or greater.

18. The method of claim 12, wherein said vertically oriented conductive spacer extends in one of said first and second directions.

19. The method of claim 18, further comprising:

forming an insulator on an exterior of said vertically oriented conductive spacer; and forming an insulating plug in an interior of said vertically oriented conductive spacer.

20. The method of claim 18, wherein:

forming a void in an interior of vertically oriented conductive spacer.

\* \* \* \* \*